US007081399B2

(12) United States Patent
Maleville et al.

(10) Patent No.: US 7,081,399 B2
(45) Date of Patent: Jul. 25, 2006

(54) METHOD FOR PRODUCING A HIGH QUALITY USEFUL LAYER ON A SUBSTRATE UTILIZING HELIUM AND HYDROGEN IMPLANTATIONS

(75) Inventors: Christophe Maleville, La Terrasse (FR); Eric Neyret, Sassenage (FR); Nadia Ben Mohamed, Renage (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 105 days.

(21) Appl. No.: 10/691,403

(22) Filed: Oct. 21, 2003

(65) Prior Publication Data

US 2005/0026426 A1 Feb. 3, 2005

(30) Foreign Application Priority Data

Jul. 29, 2003 (FR) .................................. 03 09304

(51) Int. Cl.
*H01L 21/301* (2006.01)
(52) U.S. Cl. ............................. 438/458; 257/E21.568
(58) Field of Classification Search ............... 438/118, 438/458; 257/E21.568
See application file for complete search history.

(56) References Cited

U.S. PATENT DOCUMENTS

| 6,362,076 B1 | 3/2002 | Inazuki et al. ............... 438/458 |
| 6,593,212 B1 | 7/2003 | Kub et al. .................... 438/458 |
| 6,600,173 B1* | 7/2003 | Tiwari ........................ 257/74 |
| 2002/0025604 A1 | 2/2002 | Tiwari ........................ 438/118 |
| 2005/0196936 A1* | 9/2005 | Daval et al. ................. 438/455 |

FOREIGN PATENT DOCUMENTS

| EP | 0 954 014 A1 | 11/1999 |
| FR | 2 797 713 | 2/2001 |
| FR | 797713 | 2/2001 |
| WO | WO 01/15215 | 3/2001 |

OTHER PUBLICATIONS

Jean-Pierre Colinge, "Silicon-On-Insulator Technology: Materials to VSLI", 2nd Edition by, published by "Kluwer Academic Publishers", at pp. 50 and 51.
Aditya Agarwal, et al., "Efficient production of silicon-on-insulator films by co-implantation of He+ with H+", Applied Physics Letters, vol. 72 (1998), pp. 1086-1088.

* cited by examiner

*Primary Examiner*—Anh Duy Mai
(74) *Attorney, Agent, or Firm*—Winston & Strawn LLP

(57) ABSTRACT

A method for producing a high quality useful layer of semiconductor material on a substrate. The method includes implanting at least two different atomic species into a face of a donor substrate to a controlled mean implantation depth to form a weakened zone therein and to define a useful layer. The implanting step is conducted to minimize low-frequency roughness at the weakened zone. Next, the method includes bonding a support substrate to the face of the donor substrate, and detaching the useful layer from the donor substrate along the weakened zone. A structure is thus formed that includes the useful layer on the support substrate with the useful layer presenting a surface for further processing. The technique also includes thermally treating the structure to minimize high-frequency roughness of the surface of the useful layer. The result is a surface having sufficient smoothness so that chemical mechanical polishing (CMP) is not needed.

26 Claims, 3 Drawing Sheets

METHOD FOR PRODUCING A HIGH QUALITY USEFUL LAYER ON A SUBSTRATE UTILIZING HELIUM AND HYDROGEN IMPLANTATIONS

BACKGROUND ART

The present invention generally relates to a method for producing a high quality useful layer of semiconductor material on a substrate. In particular, the method includes implanting at least two different atomic species into a face of a donor substrate to a controlled mean implantation depth to form a weakened zone therein and to define a useful layer. The implanting step is conducted to minimize low-frequency roughness at the weakened zone. Next, a support substrate is bonded to the face of the donor substrate, and the useful layer is detached along the weakened zone. A structure is thus formed that includes the useful layer on the support substrate with the useful layer presenting a surface for further processing. The technique also includes thermally treating the structure to minimize high-frequency roughness of the surface of the useful layer. The result is a surface having sufficient smoothness so that chemical mechanical polishing (CMP) is not needed.

Implanting of species is understood to mean any bombardment of atomic or ionic species, likely to introduce such species onto the material of the implanted substrate, with a maximum concentration of the implanted species situated at a preset depth from the substrate relative to the bombarded surface. Such processes, such as the SMART-CUT® type process are known. Details concerning the SMART-CUT® process can be found in the document 'Silicon-On-Insulator Technology: Materials to VLSI, 2nd Edition', by Jean-Pierre Colinge from Kluwer Academic Publishers, pages 50 and 51.

Such processes advantageously produce structures comprising a thin layer of semiconductor material. These structures can be an SOI-type (Silicon On Insulator) structure. The structures produced by such processes are used for applications in the fields of microelectronics, optics and/or optronics.

The specifications concerning the state of the surface of the structures used in these fields are generally very strict. The roughness of the thin layer is a parameter which to a certain extent affects the quality of the components which will be created on the structure. The roughness is generally expressed either by an average quadratic value known as Root Mean Square (RMS), or by a Power Spectral Density (PSD) measurement. For example, it is typical to find roughness specifications which must not exceed 5 Angströms in RMS value.

Roughness measurements can be accomplished by using an atomic force microscope AFM (Atomic Force Microscope). With this type of instrument, the roughness is measured on surfaces swept by the point of the AFM microscope, ranging from $1 \times 1$ µm$^2$ to $10 \times 10$ µm$^2$, and more rarely $50 \times 50$ µm$^2$, or $100 \times 100$ µm$^2$.

Roughness can be characterized, in particular, according to two modalities. First, the roughness can be described as being high frequency and corresponds to small-sized swept surfaces (on the order of $1 \times 1$ µm$^2$). Second, the roughness can be described as being low frequency and corresponds to larger size swept surfaces (on the order of $10 \times 10$ µm$^2$, or more). The "high frequencies" and "low frequencies" thus correspond to spatial frequencies associated with the roughness measurements. The example specification of 5 Angströms RMS given above is therefore a low-frequency roughness, corresponding to a swept surface of $10 \times 10$ µm$^2$.

Low roughness at high frequencies is particularly desirable to obtain good gate oxides. Low roughness at low frequencies (or waviness) is of interest particularly when the aim is to bond another substrate onto the free surface of the thin layer.

The thin layers which are obtained by known transfer processes (for example by using the SMART-CUT® type process) have surface roughness values that are generally greater than the specifications mentioned above, in the absence of applying a specific treatment to the surface of the thin layer. Finishing steps are therefore generally utilized on the structure following the detachment stage, to improve the quality of the thin transferred layer. More precisely, it is an object of these finishing steps to smooth out the roughness characteristics, including both high-frequency and low-frequency roughness. Such finishing steps generally make use of operations such as chemical-mechanical polishing (CMP), kiln annealing, rapid annealing, oxidation/deoxidation sequences and the like.

A first type of known process for decreasing surface roughness includes chemical-mechanical polishing of the free surface of the thin layer. This type of process effectively reduces the roughness of the free surface of the thin layer by decreasing all waviness, especially those at the lowest frequencies. However, chemical-mechanical polishing causes defects (for example, cold working defects) in the thin layer. In addition, it compromises the uniformity of the free surface of the thin layer (in particular uniformity according to very low frequencies). These disadvantages may be further aggravated in the case where it is important to polish the surface of the thin layer.

An alternative to such CMP polishing is to treat the surface of the structure by annealing in a hydrogenated atmosphere. U.S. Pat. No. 6,362,076 describes a finishing process that enables the roughness of a thin layer, transferred according to a SMART-CUT® type process, to be decreased. The finishing process includes, following a detachment step, a thermal annealing step in a reduced atmosphere containing hydrogen. Thermal annealing in a reduced atmosphere containing hydrogen enables smoothing out of the high-frequency roughness by surface reconstruction. But this treatment does not totally eliminate the lowest-frequency roughness (5 to 10 micrometers).

The published French document FR 2 797 713 describes combining two different types of surface treatments, each treatment acting on a distinct roughness frequency range. Rapid thermal annealing in a reducing atmosphere as well as chemical-mechanical polishing (CMP) are carried out, wherein these steps are distinguished by their effects on different frequency ranges. In the case of such treatment, annealing in a reducing atmosphere is beneficial for smoothing the high-frequencies roughness (a spatial period of less than 3 Angströms), but is less efficient for reducing waviness, which are the low frequency roughness parameters. Chemical-mechanical polishing is effective for decreasing the low-frequency waviness.

As discussed, chemical-mechanical polishing is intrinsically associated with certain disadvantages. Therefore, the known processes for improving the quality of the thin layer of a structure of the type described above include limitations and/or drawbacks.

SUMMARY OF THE INVENTION

Presented is a method for producing a high quality useful layer of semiconductor material on a substrate. The method includes implanting at least two different atomic species into a face of a donor substrate to a controlled mean implantation depth to form a weakened zone therein and to define a useful layer. The implanting step is conducted to minimize low-frequency roughness at the weakened zone. Next, a support substrate is bonded to the face of the donor substrate, and the useful layer is detached from the donor substrate along the weakened zone. A structure is thus formed that includes the useful layer on the support substrate with the useful layer presenting a surface for further processing. The structure is then thermally treated to minimize high-frequency roughness of the surface of the useful layer, to result is a surface having sufficient smoothness so that chemical mechanical polishing of the useful layer surface is not required.

In an advantageous embodiment, the different species are hydrogen species and helium species. In an implementation, the hydrogen and helium species are implanted sequentially, and may include implanting the helium species before implanting the hydrogen species. The helium species may be implanted at a dose of between about $0.5 \times 10^{16}$ cm$^{-2}$ and about $1.5 \times 10^{16}$ cm$^{-2}$, and the hydrogen species may be implanted at a dose of between about $0.5 \times 10^{16}$ cm$^{-2}$ and about $2.5 \times 10^{16}$ cm$^{-2}$.

In a beneficial embodiment according to the invention, the thermal treatment is a rapid thermal annealing (RTA) process carried out at a temperature of between about 800° C. and 1400° C. The RTA process may be carried out for a duration of about 1 to about 60 seconds. Advantageously, rapid thermal annealing occurs in an atmosphere that includes a mixture of argon and hydrogen, or in an atmosphere of pure argon, or in an atmosphere of pure hydrogen.

In a further advantageous embodiment, the method further includes conducting at least one stabilized oxidation (StabOx) process on the structure. The StabOx operation may include successive implementations of an oxidation operation, an annealing operation and a deoxidation operation. The annealing operation may be conducted for about two hours at a temperature of about 1100° C. In addition, the rapid thermal annealing process may be conducted on the structure prior to the StabOx process. Further, a plurality of RTA and StabOx processes may be carried out on the structure. In a variation, the StabOx operation is conducted prior to thermally treating the structure, and a plurality of StabOx and RTA processes could be conducted on the structure.

In yet another advantageous embodiment, the method of the present invention includes at least one simple oxidation operation including an oxidation operation followed by a deoxidation operation of the structure. The RTA process may be conducted prior to the simple oxidation operation, and a plurality of RTA and simple oxidation operation sequences could be conducted. In a variation, the simple oxidation process is conducted prior to a RTA process, and a plurality of simple oxidation and RTA processes could be conducted.

Use of the method according to the invention therefore improves the quality of the useful layer, or the thin superficial layer. The quality improvement means decreasing the surface roughness and improving the uniformity of such a thin layer, as well as reducing the density of defects present in useful layer. The method according to the invention thus effectively eliminates the limitations and/or disadvantages associated with the prior art. In particular, the invention effectively treats both low-frequency and high-frequency structural roughness without needing to implement a CMP type polishing.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 1:
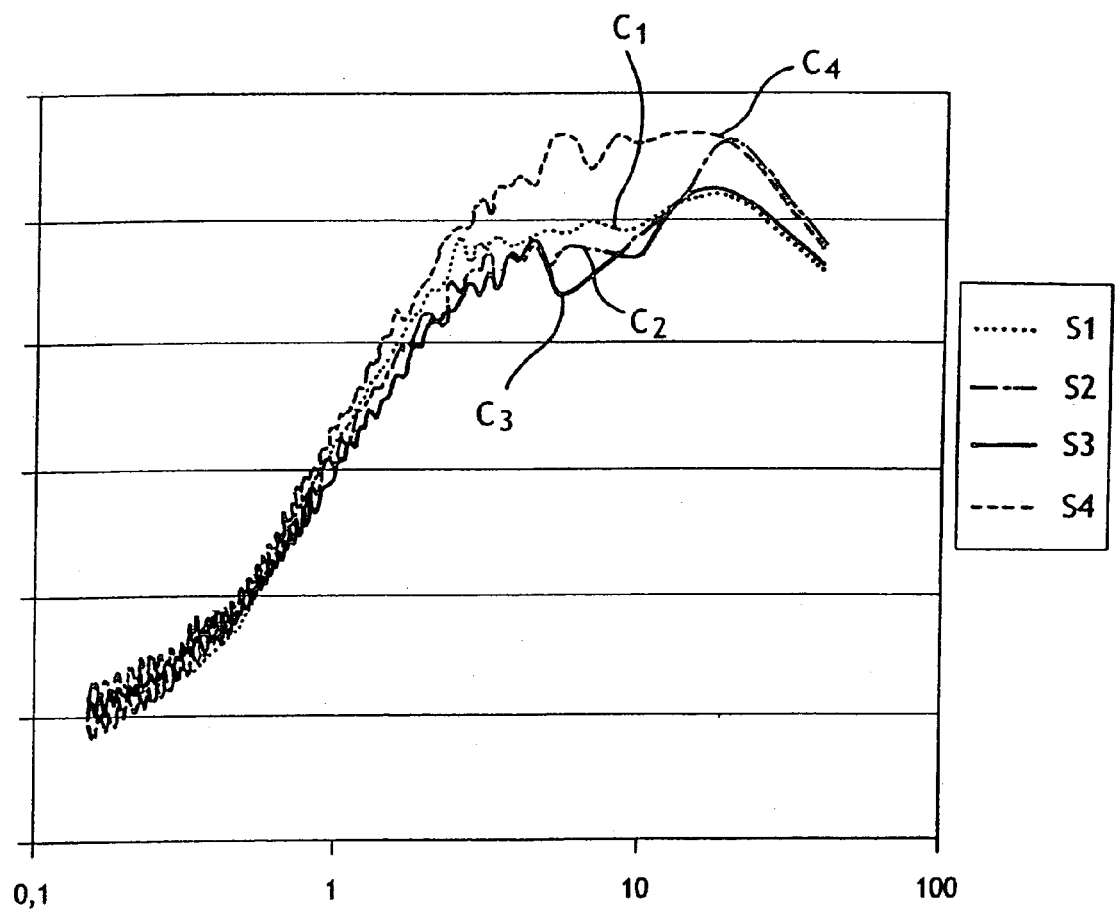
FIG. 1 is a graph showing PSD-type roughness measurements made in the center of various structures to illustrate the reduction in low-frequency roughness which results when the process according to the present invention is utilized as compared to that obtained by simple thermal treatment such as by rapid thermal annealing.

The present process relates to the production of structures that include a thin layer of semiconductor material on a support substrate, wherein the thin layer is by detachment at the level of a donor substrate that has a weakened zone created by implantation of species. The structure can be, in general, any type of structure that includes a thin layer of a semiconductor material on a surface exposed to the external environment (a free surface). Such a thin layer of semiconductor material can be, for example, silicon Si, silicon carbide SiC, germanium Ge, silicon-germanium SiGe, gallium arsenic AsGa, etc. Further, a support substrate can be made of silicon Si, quartz, and the like. A layer of oxide can also be inserted between the support substrate and the thin layer, such that the structure that is formed is a semiconductor-on-insulator structure (such as a SeOI structure), and in particular a silicon-on-insulator (SOI) structure, for example).

The invention can advantageously improve the quality of the thin layer of a structure obtained by utilizing a SMART-CUT® type transfer process. The present method could be beneficially implemented within the scope of such a transfer process to decrease the roughness of one or the other of the two surfaces of semiconductor material resulting from detachment at the level of the weakened zone. The present method includes implanting species to create a weakened zone by co-implanting at least two different species under a face of the donor substrate. In addition, after detachment at the weakened zone, a finishing step is implemented that utilizes rapid thermal annealing.

In an embodiment, hydrogen and helium species are co-implanted under the face of the donor substrate in order to form the weakened zone. Preferably, though not exclusively, co-implantation is carried out by sequentially implanting helium and then hydrogen. By experimenting with co-implantation, it has been found that the co-implantation of helium and hydrogen results in transfer of thin layers with a reduced level of roughness in comparison to the transfer following implantation of hydrogen alone. More precisely, it has been observed that the frequencies at which this improvement in roughness seems the most pronounced correspond to the frequencies of the lowest spatial frequency roughness, which are the frequencies that are generally well treated by using CMP.

Within the scope of the present process, the face of the donor substrate which has undergone co-implantation is then placed in close contact with, or bonded to, the support substrate. The donor substrate is then detached at the level of the weakened zone, to transfer a part of the donor substrate to the support substrate and to form the thin layer on the latter. These stages of bonding and detachment are known and are conventional with regard to the transfer processes mentioned above. Detachment can be carried out by supplying a thermal power, or by optionally providing a mechanical action at the level of the weakened zone.

The present process also includes a finishing step, wherein the goal is to minimize the high-frequency roughness at the level of the structure obtained after detachment. Such a finishing step may include at least one stage of rapid thermal annealing. Rapid thermal annealing is understood to mean rapid annealing, (that is, performed over a period of several seconds or several tens of seconds), in a controlled atmosphere. Such annealing is commonly called Rapid Thermal Annealing (RTA).

RTA annealing of the structure involves annealing at a high temperature, which can be, for example, on the order of about 900° C. to about 1300° C., for about 1 to about 60 seconds. RTA annealing may also be carried out in a controlled atmosphere. This atmosphere can be an atmosphere comprising a mixture of hydrogen and argon, or an atmosphere of pure argon, or even an atmosphere of pure hydrogen. The RTA annealing stage in particular reduces the surface roughness of the thin layer, essentially by surface reconstruction and smoothing. And, as mentioned earlier, RTA annealing especially benefits reduction of the roughness at high frequencies. In addition, any crystalline defects present in the thin layer, and generated in particular during implantation and detachment, are at least in part cured by this RTA annealing.

Use of the present process results in obtaining a structure with a thin layer of good quality without utilizing CMP. The structure has both a reduced high-frequency roughness as well as reduced low-frequency roughness. Implementing the process thus results in a structure comprising a thin layer having adequate quality to be suitable for use in microelectronic or optoelectronic applications.

According to a variation, the finishing stage can also include at least one stabilized oxidation step (referred to as a "StabOx" process below). A StabOx process is conventionally used during a transfer process, following the detachment stage. It is used for regulating the thickness of the thin layer and reducing the density of defects. It is also used for reinforcing the interface between the thin layer and the support substrate. Consequently, a StabOx process will be similar to a thermal treatment and a deoxidation operation.

The thermal treatment portion of the StabOx process includes successive operations of oxidation and annealing of the structure. Oxidation is known and can, for example, be carried out by heating the structure to around 900° C. in gaseous oxygen. Following the oxidation step, a layer of oxide is formed on the thin layer. The annealing step may include heating the structure at around 1100° C. for two hours, in an argon atmosphere. Such annealing simultaneously reinforces the interface between the support substrate and the face of the donor substrate which has undergone implantation, and cures certain defects generated during the implantation and detachment stages.

The deoxidation portion of the Stabox process is carried out following thermal treatment to withdraw the layer of oxide formed during the oxidation operation. Deoxidation is known, and can be performed by immersing the structure for several minutes into a solution of 10% or 20% fluorhydric acid, for example.

It will be noted that the oxide layer formed during oxidation helps to protect the underlying thin layer during annealing. It will also be noted that a part of the thin layer, in the vicinity of its free surface, is therefore consumed during such a StabOx operation.

By implementing a StabOx process during the finishing step, in addition to the RTA operation, the concentration of defects in the thin layer is reduced even more. In addition, the process smoothes the structure to a planned thickness for the finished product. In effect, the RTA annealing process aids in reconstructing the surface of the thin layer, and in rectifying certain defects in the thickness of the layer. In certain cases, the curing effect is only partial, so a supplementary StabOx step could be used to remove the material comprising a large part of the defects located in the vicinity of the free surface of the thin layer and in the thickness of the layer. This results in a further improvement in the quality of the structure.

This variant of the present process, in which the finishing step comprises a RTA step and at least one StabOx step, is therefore particularly advantageous when the gradient of concentration of defects increases in the direction of the free surface of the thin layer, and there is a significant concentration of defects in the vicinity of this surface. It will be noted that the total thickness consumed by one or more StabOx/deoxidation sequences can be advantageously controlled in order to eliminate all the defects and to bring the structure to the desired thickness.

According to a particularly advantageous embodiment, a StabOx step is carried out during the finishing stage and prior to the RTA step. This RTA/StabOx sequence results in better oxidation uniformity when the StabOx step is carried out directly after detachment, without implementing it before the smoothing RTA step. When a RTA step is implemented prior to a StabOx step, the result is a less rough surface and a more uniform surface of the thin layer. In this way the speed of oxidation is close to that obtained when a polished structure is oxidized, and is furthermore the same at any point in the structure.

In addition, it can be useful to cure crystalline defects present in the thin layer (owing to RTA) before consuming its thickness (during the StabOx/deoxidation sequence). This is more important when the thin layer is particularly fine, and therefore consumption of its thickness may, for example, punch holes therein that have not been cured previously and finished by RTA annealing.

In accordance with other embodiments, the finishing stage includes at least one RTA operation. The finishing stage may also include one of the following sequences. The finishing stage may include a RTA/StabOx operation, as just discussed, or several repeated RTA/StabOx sequences (the example implementation discussed below including, in succession, two of these RTA/StabOx sequences) or a StabOx/RTA sequence, or a StabOx/RTA/StabOx/RTA sequence.

When the finishing stage comprises at least one additional RTA treatment (as can be the case when RTA/StabOx or StabOx/RTA sequences are repeated several times), the additional RTA treatment allows continued polishing of the free surface of the thin layer. The additional RTA treatment can also be carried out at a lower temperature (for example 1000 to 1100° C.) than an initial RTA treatment. It is therefore possible to reduce the thermal budget of the repetition of the sequences mentioned above by performing RTA treatment at lower temperature.

According to another embodiment, a simple oxidation operation is carried out in place of a StabOx step. This simple oxidation operation successively comprises an oxidation stage and a deoxidation stage. The thermal budget is thus also reduced since the second StabOx operation (thermal annealing over approximately two hours) is not utilized. A reduction in the thermal budget is advantageous, in that it limits the constraints applied to the structure, and reduces the probability of generating dislocation type defects or slip lines in the crystallographic arrangement of the structure. An oxidation stage followed by a deoxidation stage can therefore replace the StabOx step in all the chain formations mentioned above.

An embodiment of the process according to the present invention will now be described in detail below, by way of a non-limiting example. This embodiment relates to the production of S1, S2, S3 type structures comprising a thin layer on a support substrate.

The thickness of the thin layer of these respective structures is between 50 and 2000 Ångströms, and the total thickness of these structures being around 700 µm. These S1, S2, S3 structures are produced by carrying out, during the implantation of species step, a co-implantation of helium then of hydrogen. The respective doses of the species are: helium, $0.7 \times 10^{16}.cm^{-2}$ and hydrogen, $0.9 \times 10^{16}.cm^{-2}$ for the S1 structure; helium, $0.8 \times 10^{16}.cm^{-2}$ and hydrogen, $0.9 \times 10^{16} cm^{-2}$ for the S2 structure; and helium, $0.9 \times 10^{16}.cm^{-2}$ and hydrogen, $0.9 \times 016\ cm^{-2}$ for the S3 structure. By way of comparison, a S4 structure is produced via implantation of hydrogen alone, with a dose of $5.5 \times 10^{16}.cm^{-2}$, which is a dose almost three times greater than the total dose implanted during co-implantation.

A common advantage of the co-implantation technique is that there is a reduction by a factor of approximately 3 of the implanted dose relative to implantation of a single type of species. This reduction translates to a reduction in the implantation time, and results finally in reduced costs associated with production of structures comprising a thin layer on a support substrate, in particular by means of a SMART-CUT® transfer process type. This known advantage, for example, is disclosed in the document by Aditya Agarwal, T. E. Haynes, V. C. Venezia, O. W. Holland, and D. J. Eaglesham, "Efficient production of silicon-on-insulator films by co-implantation of He+ with H+", Applied Physics Letters, vol. 72 (1998), pages 1086–1088, in which it is established that the co-implantation of hydrogen and helium aids in decreasing the doses that have to be implanted. It should also be noted that this document recites that the superficial SOI layer obtained by co-implantation of hydrogen and helium exhibits roughness comparable to that of the surface SOI layer obtained by implantation of just hydrogen. Consequently, this document does not disclose bringing about any improvement in surface roughness due to co-implantation (and thus apparently does not propose exploitation of such an effect).

With reference to the present method, following the co-implantation step, as already mentioned, the steps of close contact bonding and detachment are conducted, and then a finishing step including at least a RTA is conducted, so as to obtain the final S1, S2, S3 and S4 structures. In particular, PSD roughness measurements of each of these structures were taken with the aid of an AFM microscope.

FIG. 1 shows the power of the different spectral constituents of the roughness of each of the example S1, S2, S3 and S4 structures. The abscissa shown in the diagram of FIG. 1 is therefore the spatial period (in µm), which describes the roughness frequencies observed, from high frequencies (to the left of this axis) to low frequencies (to the right of this axis). These measurements were taken at the edge of the structure at the level of the weakened zone, where detachment is triggered during the detachment step. This zone consequently generally has a relatively severe roughness.

FIG. 1 shows the result of such measurements on a swept surface of $40 * 40\ µm^2$ (this surface of $40 * 40\ µm^2$ therefore corresponding to the maximum frequency according to which the roughness can be observed). FIG. 1 therefore shows the difference in roughness between the S1, S2, S3 and S4 structures, after RTA treatment of the structures. A first curve C4 illustrates the roughness of the S4 structure made by the conventional implantation of hydrogen alone. The three other curves C1, C2 and C3 illustrate the roughness of structures S1, S2 and S3, respectively, produced by the present process which combines co-implantation and RTA annealing. These three curves C1, C2, C3 correspond to different doses of co-implanted species.

FIG. 1 characterizes the fracture faces by analyzing the frequencies comprising roughness, and demonstrates the advantage gained utilizing a co-implantation process with RTA. FIG. 1 confirms the fact that low-frequency roughness of the S1, S2 and S3 structures that are produced according to the present method is substantially lower than that of the S4 structure which was produced in a conventional manner. In particular, a net decrease in roughness for spatial periods of substantially between 3 and 15 µm is observed.

Co-implantation therefore enables low-frequency roughness to be limited, while high-frequency roughness is equivalent, or slightly less, than the case where only hydrogen is implanted. Use of successive steps of co-implantation, bonding, detachment and RTA therefore lowers roughness values more than the known process of implanting hydrogen species alone, followed by bonding, detachment, and RTA steps.

It is also possible to vary the implantation doses of the co-implanted species (in particular the dose of helium in the example presented herein) while preserving lower values of low-frequency roughness compared to that of the conventional technique noted above.

According to an embodiment of the present process, the finishing step comprises, apart from the RTA step, successive StabOx, RTA and StabOx steps (or a finishing stage comprising repetition of two RTA/StabOx sequences). As has already been shown, such a finishing stage allows for consumption of the thickness of the thin layer and a reduction in the residual implantation defects under the surface after detachment. In addition, the bond at the thin layer/support substrate adhesion interface is strengthened via annealing that is carried out during the StabOx stages. Moreover, the process can be used to bring the structure to the desired thickness for the finished product, and the surface can be further smoothed by using an additional RTA treatment.

Figure 2:
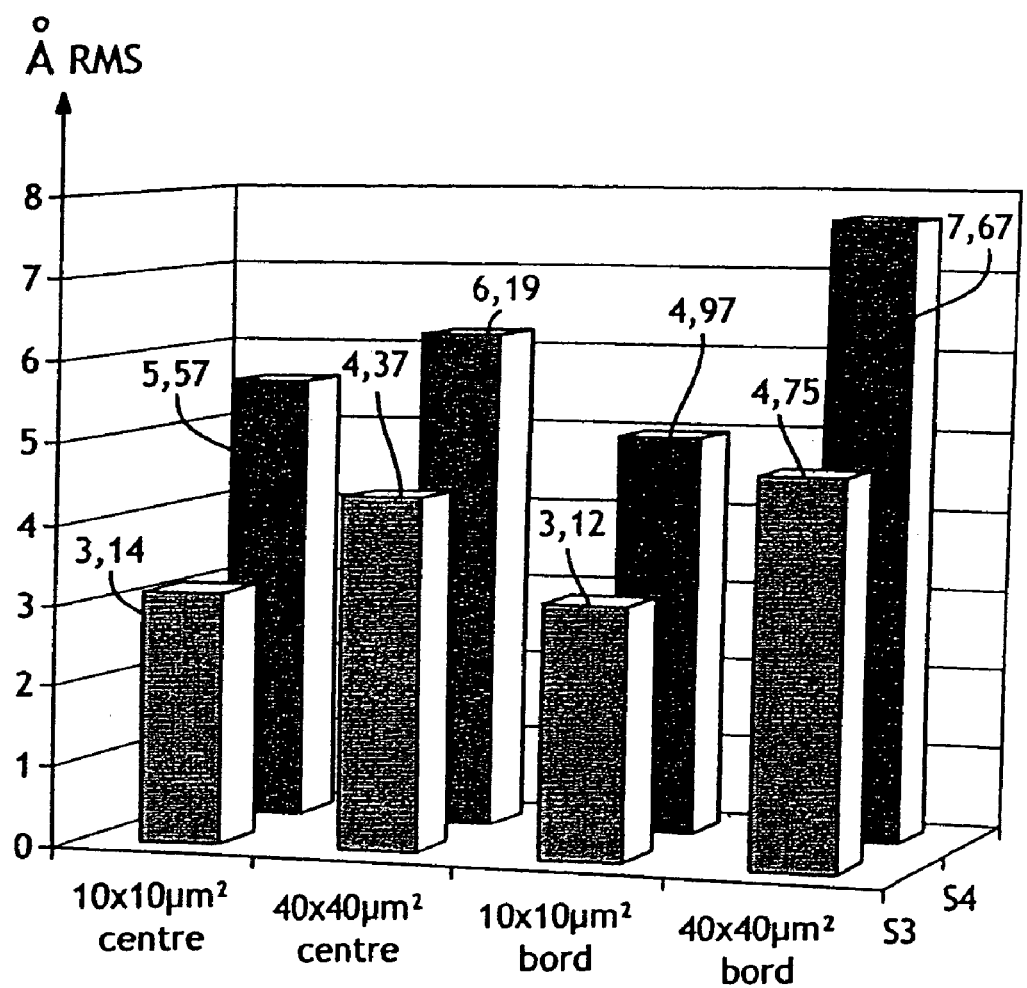
FIG. 2 is a graph showing RMS roughness measurements and illustrates the reduction in low-frequency roughness which results when the process according to the present invention is utilized without using a CMP step.

FIG. 2 compares the RMS surface roughness of the S3 type structure obtained by an embodiment according to the present invention to that of the surface of the S4 type structure obtained by a conventional process. Roughness measurements were conducted using an AFM microscope sweeping surfaces of $10 * 10\ µm^2$ and $40 * 40\ µm^2$, both at the center of the structures as well as at their edge (i.e. at the weakened zone where detachment is triggered). In FIG. 2 (the ordinate axis is in RMS Ångströms), the bars in the first plane show the roughness measured for the S3 type structure, whereas the bars in the second plane represent roughness measured for the S4 type structure. In FIG. 2, a net decrease in roughness for the S3 structure is observed, especially for low spatial frequencies.

Figure 3A:
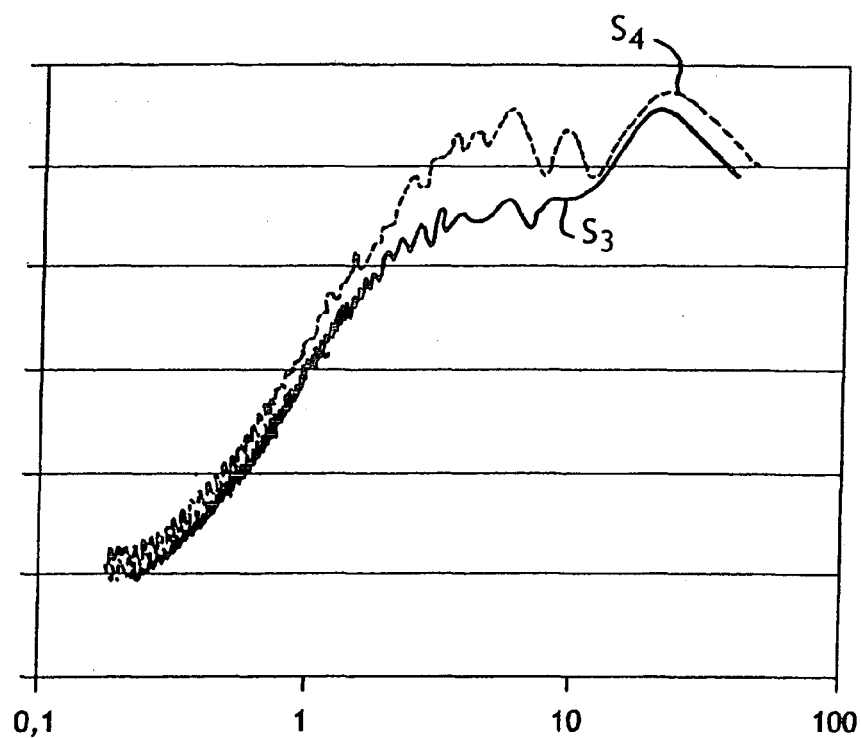
FIGS. 3a and 3b are graphs similar to that of FIG. 1, and illustrate the reduction in roughness obtained by using a process according to the invention at the center of a structure and at the edge of the same structure, respectively.
Figure 3B:
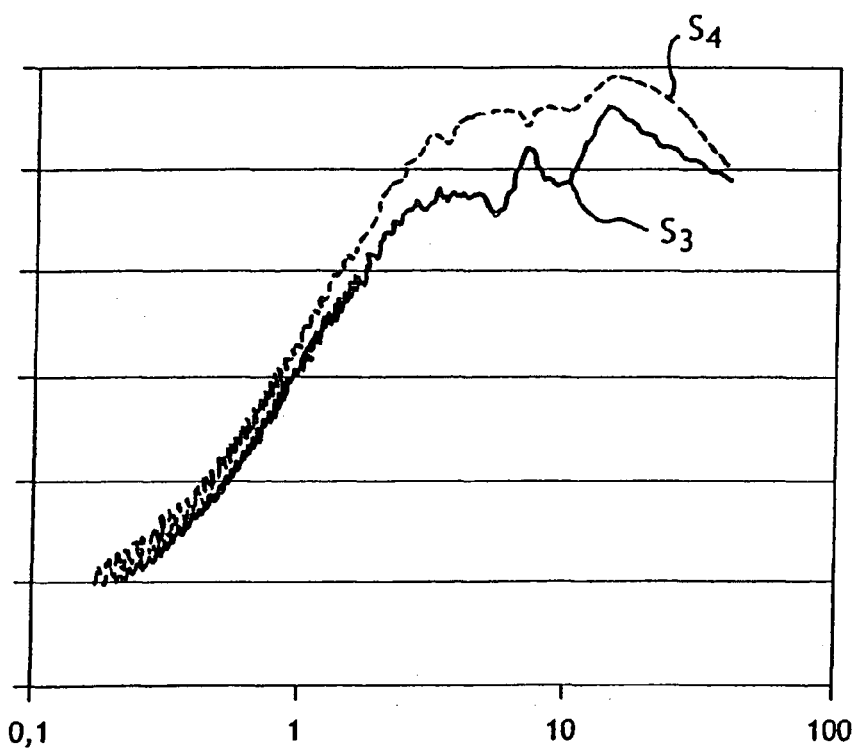

FIGS. 3a and 3b illustrate graphs similar to that of FIG. 1, and illustrate the reduction in roughness obtained by using the present technique in the center of a structure and at the edge of this structure, respectively. FIGS. 3a and 3b allow comparison of the PSD roughness of a structure of the S3 type obtained by implementing the invention to that of a structure of the S4 type obtained by a conventional process both at the center of the structures (FIG. 3a), as well as at their edges (FIG. 3b). In these cases, the swept surfaces had dimensions of 40*40 µm². It can be observed in each of FIGS. 3a and 3b that the roughness of the structure S3 is less than that of the structure S4, especially at low spatial frequencies (in particular when the spatial period is between 3 and 15 µm). Roughness uniformity is better for the S3 structure than for the S4 structure (wherein the differences in uniformity between the edge and the center of the S3 structure are effectively attenuated).

It is noted that the present process is an original approach for preventing significant roughness (in particular at low-frequency) from occurring. Thus, the present method differs from known treatments which are "curative", to the extent that the technique intervenes to produce structures having a given roughness.

What is claimed is:

1. A method for producing a high quality useful layer of semiconductor material on a substrate, which comprises:
   implanting at least two different atomic species into a face of a donor substrate to a controlled mean implantation depth to form a weakened zone therein and to define a useful layer;
   bonding a support substrate to the face of the donor substrate;
   detaching the useful layer from the donor substrate along the weakened zone to form a structure that includes the useful layer on the support substrate with the useful layer presenting a useful layer surface for further processing, wherein the different atomic species are implanted so that the useful layer surface is provided with a low-frequency roughness of less than about 5 Å measured over a sweep area of about 40×40 µm² after the detachment of the useful layer at the weakened zone without chemical mechanical polishing; and
   thermally treating the structure to minimize high-frequency roughness of the useful layer surface to thus provide sufficient smoothness so that chemical mechanical polishing of the useful layer surface is not required.

2. The method of claim 1 wherein the different species comprises hydrogen species and helium species.

3. The method of claim 2 which further comprises sequentially implanting the hydrogen and helium species.

4. The method of claim 3 which further comprises implanting the helium species before implanting the hydrogen species.

5. The method of claim 2 wherein the helium species is implanted at a dose of between about $0.5\times10^{16} cm^{-2}$ and about $1.5\times10^{16} cm^{-2}$.

6. The method of claim 2 wherein the hydrogen species is implanted at a dose of between about $0.5\times10^{16} cm^{-2}$ and about $2.5\times10^{16} cm^{-2}$.

7. The method of claim 1 wherein the thermal treatment is a rapid thermal annealing process carried out at a temperature of between about 800° C. and 1400° C.

8. The method of claim 7 wherein the rapid thermal annealing process is carried out for a duration of about 1 to about 60 seconds.

9. The method of claim 7 wherein the rapid thermal annealing process is conducted in an atmosphere comprising a mixture of argon and hydrogen.

10. The method of claim 7 wherein the rapid thermal annealing process is conducted in an atmosphere of pure argon.

11. The method of claim 7 wherein the rapid thermal annealing process is conducted in an atmosphere of pure hydrogen.

12. The method of claim 1 which further comprises conducting at least one stabilized oxidation process on the structure.

13. The method of claim 12 wherein the stabilized oxidation process comprises successive implementations of an oxidation operation, an annealing operation and a deoxidation operation.

14. The method of claim 13 which further comprises conducting the annealing operation for about two hours at a temperature of about 1100° C.

15. The method of claim 12 which further comprises conducting a rapid thermal annealing process on the structure prior to the stabilized oxidation process.

16. The method of claim 12 which further comprises conducting a plurality of rapid thermal annealing and stabilized oxidation processes on the structure.

17. The method of claim 12 wherein the stabilized oxidation operation is conducted prior to thermally treating the structure.

18. The method of claim 17 which further comprises conducting a plurality of stabilized oxidation and rapid thermal annealing processes on the structure.

19. The method of claim 1 which further comprises at least one simple oxidation operation including an oxidation operation followed by a deoxidation operation of the structure.

20. The method of claim 19 which further comprises conducting a rapid thermal annealing process prior to the simple oxidation operation.

21. The method of claim 19 which further comprises conducting a plurality of rapid thermal annealing and simple oxidation processes on the structure.

22. The method of claim 19 wherein the simple oxidation is conducted prior to a rapid thermal annealing process.

23. The method of claim 22 which further comprises conducting a plurality of simple oxidation and rapid thermal annealing processes on the structure.

24. The method of claim 5, wherein the helium species is implanted at a dose of about $0.9\times10^{16} cm^{-2}$ or less.

25. The method of claim 24, wherein the hydrogen species is implanted at a dose of between about $0.5\times10^{16} cm^{-2}$ and about $0.9\times10^{16} cm^{-2}$.

26. The method of claim 8, wherein the rapid thermal annealing process is conducted in an atmosphere comprising pure argon or hydrogen or a mixture thereof.

* * * * *